United States Patent
Udrea et al.

(10) Patent No.: US 12,457,763 B2
(45) Date of Patent: Oct. 28, 2025

(54) III-NITRIDE POWER SEMICONDUCTOR BASED HETEROJUNCTION DIODE

(71) Applicant: Cambridge GaN Devices Limited, Cambridge (GB)

(72) Inventors: Florin Udrea, Cambridge (GB); Martin Arnold, Cambridge (GB); Loizos Efthymiou, Cambridge (GB); Giorgia Longobardi, Cambridge (GB); Sheung Wai Fung, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 822 days.

(21) Appl. No.: 17/589,735

(22) Filed: Jan. 31, 2022

(65) Prior Publication Data
US 2023/0246098 A1    Aug. 3, 2023

(51) Int. Cl.
*H10D 30/47* (2025.01)
*H10D 62/17* (2025.01)
*H10D 62/85* (2025.01)
*H10D 84/80* (2025.01)

(52) U.S. Cl.
CPC ........... *H10D 30/47* (2025.01); *H10D 62/364* (2025.01); *H10D 62/8503* (2025.01); *H10D 84/811* (2025.01)

(58) Field of Classification Search
CPC ............... H01L 29/778; H01L 27/0629; H01L 29/1079; H01L 29/2003; H01L 21/8252; H01L 27/0605; H03K 2017/307; H03K 2217/0081; H03K 17/305; H10D 30/47; H10D 84/811

USPC .......................................... 257/107, 139, 140
See application file for complete search history.

(56) References Cited

U.S. PATENT DOCUMENTS

| | | | | |
|---|---|---|---|---|
| 6,163,202 | A * | 12/2000 | Mao | H02M 3/156 323/907 |
| 2011/0284862 | A1* | 11/2011 | Zhang | H01L 27/0255 257/E29.089 |
| 2020/0161962 | A1* | 5/2020 | Liu | H02M 1/4208 |
| 2020/0357907 | A1* | 11/2020 | Udrea | H01L 27/0605 |
| 2020/0357909 | A1* | 11/2020 | Udrea | H01L 29/66462 |

OTHER PUBLICATIONS

U. K. Mishra et al., GaN-Based RF power devices and amplifiers, Proc. IEEE, vol. 96, No. 2, pp. 287-305, 2008.

(Continued)

*Primary Examiner* — Eva Y Montalvo
*Assistant Examiner* — Nicholas B Michaud
(74) *Attorney, Agent, or Firm* — Tarolli, Sundheim, Covell &Tummino LLP

(57) ABSTRACT

We describe a smart high voltage/power III-nitride semiconductor based diode or rectifier comprising first and second terminals, and further comprising an active device (e.g. a transistor such as a GaN HEMT transistor), a sensing device (e.g. a sensing diode/transistor), a sensing load (e.g. a resistor), wherein the smart high voltage/power III-nitride semiconductor based diode or rectifier is configured to output a sensing signal corresponding a current through the sensing device and/or a voltage drop across the sensing load, wherein the sensing signal is indicative of a current flowing between the first and second terminal when a bias is applied between the first and second terminals.

18 Claims, 10 Drawing Sheets

(56) References Cited

OTHER PUBLICATIONS

M. H. Kwan el al, CMOS-Compatible GaN-on-Si Field-Effect Transistors for High Voltage Power Applications, IEDM, San Fran., Dec. 2014, pp 17.61-17.64.
S. Lenci et al., Au-free AlGan/GaN power diode 8-in Si substrate with gated edge termination, Elec. Dev. Lett., vol. 34, No. 8, pp. 1035, 2013.
D. Disney, H. Nie, A. Edwards, D. Bour, H. Shah and I. C. Kizilyalli, "Vertical power diodes in bulk GaN," 2013 25th International Symposium on Power Semiconductor Devices & IC's (ISPSD), 2013, pp. 59-62.

* cited by examiner

III-NITRIDE POWER SEMICONDUCTOR BASED HETEROJUNCTION DIODE

BACKGROUND

A power or high voltage diode or rectifier is a semiconductor device used in power electronics in various applications, such as rectification, free-wheeling or as a bootstrap or as a pair to a transistor (connected in anti-parallel configuration to a high voltage transistor).

Diodes have a forward conduction (on-state) when the anode is positively biased against the cathode. Often they have a turn-on voltage, which varies in different types of diodes, based on their material or principle of operation. The turn-on voltage (voltage at which the on-state current becomes significant) in Silicon p-n diodes is around 0.7V while in Silicon Schottky diodes it is 0.3V. In Silicon Carbide Schottky diodes, the turn-on voltage is around 1.2-1.7V.

High voltage diodes or power diodes have larger on-state voltage drops due to an additional potential drop in the drift region. Diodes have reverse blocking capability (off-state) when the cathode is positively biased against the anode. Their voltage blocking range depends on the properties of their drift region (the region which blocks the voltage within a depletion layer), such as material used, dimensions and doping levels.

Gallium Nitride (GaN) has recently been introduced as a material in the field of power electronics enabling the development of devices with increased power density, reduced on-resistance, and high frequency response. The wide band gap of the material ($E_g$=3.39 eV) results in a high critical electric field ($E_c$=3.3 MV/cm) which can lead to the design of devices with a shorter drift region, and therefore lower on-state resistance if compared to a silicon-based device with the same breakdown voltage [1]. The use of an AlGaN/GaN heterostructure also allows the formation of a two-dimensional electron gas (2DEG) at the hetero-interface where carriers can reach very high mobility ($\mu$=2000 cm$^2$/(Vs)) values [1]. In addition, the piezopolarization charge present at the AlGaN/GaN heterostructure results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters [2],[3].

Different types of GaN diodes and rectifiers have been reported in prior art [3][4]. Lateral GaN-on-Si HEMT based diodes/rectifiers are attractive due to low cost of manufacturing and the option of monolithic integration with other components. In general, they offer high switching speed and low form factor (low size dimensions) mainly due to their compact drift region, where most of the blocking voltage is supported. A GaN HEMT diode could be built by using a HEMT device with its gate connected to the source and forming the anode terminal of the diode and the drain forming the cathode terminal of the diode. The HEMT could use a Schottky or p-GaN gate. The p-GaN gate HEMT could be a normally-off device.

A typical I-V characteristic of a p-GaN HEMT based diode (based on a normally-off —GaN gate HEMT) can be seen in FIG. 1. At Vgs=0V a significant voltage drop is present between the anode and cathode. This leads to significant conduction losses in this mode of operation lowering the overall efficiency of an application.

As illustrated in FIG. 1 a significantly reduced voltage drop is observed if the gate terminal of the HEMT-based diode is actively driven (e.g. Vgs=6V), rather than hard-wired to the source terminal of the HEMT (anode terminal of the diode). However, operating the gate terminal at elevated voltages is not desirable in the reverse operation mode of the diode, as in this mode the diode needs to block the high voltage between cathode and anode terminals.

SUMMARY

It is an object of the present invention to provide a smart high voltage/power III-nitride semiconductor based diode or rectifier based on an active device (e.g. an active heterojunction transistor such as a GaN HEMT transistor), that is able to sense the current in the forward conduction of the diode through the use of a sensing device (e.g. diode) (said sensing device may be monolithically integrated) and an internal or external sensing load.

While the examples described in the present disclosure relate to GaN HEMTs, it will be understood that aspects of the present disclosure may equally be applied to devices based on other materials such as indium based nitrides and/or aluminium based nitrides In some examples, the current signal from the sensing diode or the voltage drop across the sensing load could provide a reading of the current through the smart GaN diode and this signal could be fed to an external controller circuit. Upon the detection of a forward current signal from the sensing diode or a forward voltage drop across the sensing load, greater than a sensing threshold value, the potential of the gate terminal could be raised above the potential of the source, preferably by more than the HEMT threshold voltage, such to enable a highly conductive 2DEG to form under the gate region in order to lower the forward voltage drop of the smart diode/rectifier. This could be done with the help of an internal (e.g. monolithically integrated) or external feedback circuit (i.e. active circuit or active stage) connected between the sensing load and the gate terminal. Thus, during the forward conduction of the smart GaN diode/rectifier, the gate terminal could preferably be raised to a value above the threshold voltage of the HEMT with respect to the source/anode. While the gate terminal would preferably rise above the threshold of the HEMT with respect to the source/anode, any increase above source/anode potential, even below the threshold voltage level, may lead to a reduced forward voltage drop across the GaN diode/rectifier device. During the reverse blocking mode the gate terminal could have the same potential as the source/anode (i.e. below the threshold voltage of the HEMT, so that no 2DEG channel is formed under the gate in this mode of operation). The gate terminal may also have a negative potential compared to the source terminal in reverse blocking mode.

The signal defining when the gate should be actively driven, such that the device benefits from enhanced forward conduction, would be derived by sensing the current through a diode sense device, or the voltage drop across a sensing load. The sense diode has an identical structure to the main diode but occupies a known fraction of the area of the main diode (e.g. 5 times or 10 times or 100 times less). The sense diode is connecting to a sensing load (e.g. could be a resistive load, either internal or external). By measuring the forward voltage drop across the sensing load, the magnitude of the current in the main diode or the voltage drop across the main diode may be calculated. Furthermore, once the voltage across the sensing load is above a sensing threshold voltage, the gate of the HEMT can be switched on so that the device benefits from enhanced forward conduction with a smaller on-state voltage drop. This leads to a significant reduction in the on-state losses of the diode, bringing further benefits in terms of the energy efficiency of the system where the diode is used.

We disclose a smart high voltage or power III-nitride semiconductor based heterojunction diode.

In some examples, the area of the sensing device may be smaller than the area of the active heterojunction transistor by a factor of at least 5. In some examples by a factor of at least 10, a factor of at least 100, or by a factor of at least 1000. (The area of the sensing device may be smaller than the area of the active heterojunction transistor by any factor greater than or equal to 5.)

In some examples, alternatively or in addition to the area of the sensing device being smaller than the area of the active heterojunction transistor, a gate width of the sensing device may be smaller than a gate width of the active heterojunction transistor by a factor of at least 5. In some examples by a factor of at least 10, a factor of at least 100, or by a factor of at least 1000.

It will be understood that the various examples disclosed in relation to the aspects of the invention below may be equally applied to any of the aspects of the invention.

According to a first aspect of the invention, there is provided a III-nitride power semiconductor based heterojunction diode (also termed in this disclosure as the smart high voltage/power GaN diode or Smart GaN rectifier) comprising a first terminal and a second terminal and further comprising a substrate and an active heterojunction transistor formed on the substrate, the active heterojunction transistor comprising:
  i. a III-nitride semiconductor region comprising a heterojunction comprising an active two-dimensional carrier gas;
  ii. a source terminal operatively connected to the III-nitride semiconductor region and further connected to the first terminal;
  iii. a drain terminal laterally spaced from the first terminal and operatively connected to the III-nitride semiconductor region and further connected to the second terminal;
  iv. an active gate region formed over the III-nitride semiconductor region and between the first terminal and the second terminal; and
  v. an internal gate terminal operatively connected to the active gate region;
  b. the III-nitride power semiconductor based heterojunction diode further comprising a sensing device, the sensing device comprising:
  i. a sensing device source terminal;
  ii. a sensing device drain terminal; and
  iii. a sensing device gate terminal;
  iv. wherein an area of the sensing device is smaller than an area of the active heterojunction transistor by a factor of at least 5;
  c. the III-nitride power semiconductor based heterojunction device further comprising a sensing load, the sensing load comprising a first sensing load terminal and a second sensing load terminal;
  d. wherein the first sensing load terminal is connected to the first terminal;
  e. wherein the sensing device source terminal is connected to the second sensing load terminal; and
  f. wherein the sensing device drain terminal is connected to the drain terminal of the active heterojunction transistor; and
  g. wherein the III-nitride semiconductor based heterojunction diode further comprises an output;
  wherein the output is configured to output a sensing signal corresponding to a current through the sensing device and/or a voltage drop across the sensing load, the sensing signal being indicative of a current flowing between the first terminal and the second terminal when a bias is applied between the first terminal and the second terminal.

For example, the sensing signal may be indicative of a current flowing between the first terminal and the second terminal when the first terminal is biased positively with respect to the second terminal.

In some examples, the first terminal of the III-nitride power semiconductor based heterojunction diode may be an anode terminal, and the second terminal of the III-nitride power semiconductor based heterojunction diode may be a cathode terminal.

In some examples, the active device may comprise an active heterojunction transistor (e.g. a GaN HEMT). In several of the examples described herein, the terms "active device", "active heterojunction transistor", and "GaN HEMT" are used interchangeably.

In some examples, the sensing device may comprise a sensing transistor. In some examples, the sensing device may comprise a sensing diode. In several of the examples described herein, the terms "sensing device", "sensing transistor", and "sensing diode" are used interchangeably.

It will be understood that the designations "sensing device source terminal", "sensing device drain terminal", and "sensing device gate terminal" serve to differentiate the source terminal, drain terminal, and gate terminal of the sensing device from the source terminal, drain terminal, and gate terminal of the active heterojunction transistor.

It will be understood that the designations "first sensing load terminal" and "second sensing load terminal" serve to differentiate first and second terminals of the sensing load from the first and second terminals (e.g. anode and cathode terminals) of the III-nitride power semiconductor based heterojunction diode.

In some examples, the sensing device (e.g. sensing transistor or diode) may be structurally similar to the active heterojunction transistor.

The sensing device may further comprise a sensing device internal gate terminal.

In some examples, the sensing device may be structurally identical to the active heterojunction transistor.

For example, the sensing device may comprise:
  i. a sensing device III-nitride semiconductor region comprising a heterojunction comprising a sensing device two-dimensional carrier gas;
  ii. a sensing device gate region formed over the sensing device III-nitride semiconductor region; and
  iii. a sensing device internal gate terminal;
  iv. wherein the sensing device source terminal is operatively connected to the sensing device III-nitride semiconductor region;
  v. wherein the sensing device drain terminal is operatively connected to the sensing device III-nitride semiconductor region; and
  vi. wherein the sensing device internal gate terminal is operatively connected to the sensing device gate region.

It will be understood that the designations "sensing device III-nitride semiconductor region", "sensing device two-dimensional carrier gas", "sensing device internal gate terminal", and "sensing device gate region" serve to differentiate the III-nitride semiconductor region, two-dimensional carrier gas, internal gate terminal, and gate region of the sensing device from corresponding features of the active heterojunction transistor.

A "current through the sensing device" may mean a current flowing between the sensing device source terminal and the sensing device drain terminal or vice versa.

A "voltage drop across the sensing load" may mean a voltage or potential drop between the first sensing load terminal and the second sensing load terminal. The voltage or potential drop may be positive or negative.

In some examples, a current through the sensing device may correspond to a current between the first and second terminals (e.g. anode and cathode terminals) of the III-nitride power semiconductor based heterojunction diode reduced by a factor of e.g. 5, 10, 100, or 1000. For example, the current through the sensing device may be reduced relative to the current between the first and second terminals of the III-nitride power semiconductor based heterojunction diode in proportion to the relative difference in area or gate width between the active heterojunction transistor and the sensing device.

It will be understood that the current through the sensing device and/or the voltage drop across the sensing load may be output as one or more signals (e.g. sensing signals) to enable measurement of the current through the sensing device and/or the voltage drop across the sensing load.

In some examples, the sensing load may be monolithically integrated with the active heterojunction transistor and/or the sensing device.

Alternatively, the sensing load could be external and not monolithically integrated. In this example, at least one additional terminal may be required to accommodate the connection of an external sensing load.

The gate of the sensing device could be connected to (i) internal gate terminal, (ii) its own source terminal (iii) a fixed potential (iv) another circuit block as described in some embodiments below.

The active heterojunction transistor used in smart GaN diode is preferably a HEMT transistor such as a pGaN gate HEMT transistor made of several identical fingers or cells. It will be understood that "identical fingers or cells" may mean features fabricated within the same process layers and having identical dimensions and materials. Fingers or cells could be added to increase the forward current proportionally through the diode. Interdigitated fingers where anode and cathode layers are formed in an alternate layout design are a preferred solution as this leads to a compact design. The active heterojunction transistor may also be referred to as the main HEMT.

The sensing device could also be made of one or more fingers (such as interdigitated fingers) or one or more cells but featuring a much smaller number of structures (e.g. 5×, 10×, 100× or 1000× smaller in area when compared to those of the active heterojunction transistor). Alternatively, the ratio in the size of the active heterojunction transistor and the sensing device could be expressed in terms of gate width.

Preferably, the sensing device may be an identical HEMT transistor (in terms of cross section design, but with a smaller active area) to the active heterojunction transistor onto which the smart diode is based, and have its own gate terminal connected to the internal gate terminal of the active heterojunction transistor. In this case, the sensing device is referred to as a sensing transistor.

Alternatively, the sensing device may have its own gate connected to its source terminal, in which case the sensing device acts as a two-terminal sensing diode. For example, the sensing device internal gate terminal may be connected to the sensing device source terminal.

Alternatively, the sensing device may have its own gate connected to a separate fixed potential. In another example, the potential may not be fixed but rather may be an adjustable voltage which may be controlled by an additional analogue circuit. The additional analogue circuit may be monolithically integrated or external.

These different options for the connection of the gate terminal of the sensing device may be implemented in all aspects of the invention described herein.

The sensing load may be a resistance (for simplicity) or a resistive load (made of depletion HEMT or transistors behaving like non-linear resistors), or a network of resistors and transistors. In the case of a network of resistors and transistors, this may be advantageous to provide temperature compensation, such that the sensitivity of the forward current sensing is not affected or is affected less by the operating temperature or the ambient temperature. Alternatively, the temperature compensation function may be implemented in the signal conditioning block described herein.

The sensing load may comprise one or more resistors, capacitors, current sources and diodes.

For example, the sensing load may comprise a resistive or non-linear element comprising any or a combination of resistors, capacitors, current sources and diodes.

Alternatively, a winding of a current sense transformer could form part of the sensing load. In this case, the current sense transformer is preferably an external component. In this example, at least one additional terminal may be required to accommodate the connection of an external sensing load.

The potential drop across the sensing load or the current through the sensing device could be used as signals (e.g. sensing signals) provided to an external controller circuit (e.g. as an input), which in turn could instruct a gate driver (external or monolithically integrated) to switch the device on or off as appropriate.

For example, the III-nitride power semiconductor based heterojunction diode could comprise an output configured to output a signal corresponding to the current through the sensing device and/or the voltage drop across the sensing load. The output signal could form e.g. an input to an external controller circuit as described above.

The potential drop across the sensing load could be amplified by an amplifier circuit before being used as an input to the controller circuit. This can increase the sensitivity of the diode forward current sensing. Sensitivity can be defined as the ratio between the voltage drop across the sensing load and the current flowing through the two terminals anode and cathode.

A signal conditioning block circuit could be monolithically integrated within the smart GaN diode (or provided externally) to amplify the sensing signal, provide immunity to noise or improve the linearity of the sensing signal in examples of this invention where linearity of the sensing signal is an important parameter. The signal conditioning circuit could also, or instead, provide one or more temperature compensation functions in order to provide a more accurate current sensing function at different ambient or operating temperatures.

It will be understood that the signal conditioning block may receive a signal corresponding to the voltage drop across the sensing load (e.g. the sensing signal). E.g., the signal conditioning block may be connected to the sensing load second terminal.

In some examples, the signal conditioning block may not be monolithically integrated.

The signal conditioning circuit may comprise circuit blocks such as an amplifier, buffer, Schmitt trigger, latching circuit, voltage follower, logic gate, inverter, level shifter, filter or similar.

It will be understood that the signal conditioning block(s) may be configured to receive the sensing signal as an input, and then to output the sensing signal (following conditioning) via the output.

The III-nitride power semiconductor based heterojunction diode according to the first aspect of the invention could be an intrinsic part of a device which has an additional external terminal—the control terminal. The control terminal could be connected to the internal gate of the active heterojunction transistor. When the second terminal has a higher potential than the first terminal, the device behaves as a switch with the control terminal modulating the flow of current from the second terminal to the first terminal, and wherein the first terminal has a higher potential than the second terminal the III-nitride power semiconductor based heterojunction device behaves as a diode as described in the first aspect of this invention.

According to a second aspect of this invention, there is provided a III-nitride power semiconductor based heterojunction diode (also termed in this disclosure as the smart high voltage/power GaN diode) comprising a first terminal and a second terminal and further comprising a substrate and an active heterojunction transistor formed on the substrate, the active heterojunction transistor comprising:
  i. a III-nitride semiconductor region comprising a heterojunction comprising an active two-dimensional carrier gas;
  ii. a source terminal operatively connected to the III-nitride semiconductor region and further connected to the first terminal;
  iii. a drain terminal laterally spaced from the first terminal and operatively connected to the III-nitride semiconductor region and further connected to the second terminal;
  iv. an active gate region formed over the III-nitride semiconductor region and between the first terminal and the second terminal; and
  v. an internal gate terminal operatively connected to the active gate region;
    b. the III-nitride power semiconductor based heterojunction diode further comprising a sensing device, the sensing device comprising:
  i. a sensing device source terminal; and
  ii. a sensing device drain terminal;
  iii. wherein an area of the sensing device is smaller than an area of the active heterojunction transistor by a factor of at least 5;
    c. the III-nitride power semiconductor based heterojunction device further comprising a sensing load, the sensing load comprising a first sensing load terminal and a second sensing load terminal;
    d. wherein the first sensing load terminal is connected to the first terminal;
    e. wherein the sensing device source terminal is connected to the second sensing load terminal; and
    f. wherein the sensing device drain terminal is connected to the drain terminal of the active heterojunction transistor;
    g. wherein
  i. when a bias is applied between the first terminal and the second terminal, and when a potential is provided to the internal gate terminal; and
  ii. when a current through the sensing device is a forward current, and/or when a voltage drop across the sensing load is a positive voltage drop (i.e. higher potential on the first sensing load terminal compared to the second sensing load terminal):
  iii. the potential provided to the internal gate terminal is configured to increase to a potential that is greater than a potential at the first terminal.

Increasing a potential provided to the internal gate terminal when a current through the sensing device is a forward current, and/or when a voltage drop across the sensing load is a positive voltage drop, wherein the potential provided to the internal gate terminal is increased to be greater than a potential at the first terminal, may cause an additional electron charge to form within the two-dimensional carrier gas, thereby further causing an on-state voltage drop between the first terminal and the second terminal to be lowered.

In some examples, the area of the sensing device may be smaller than the area of the active heterojunction transistor by a factor of at least 5. In some examples by a factor of at least 10, a factor of at least 100, or by a factor of at least 1000.

In some examples, alternatively or in addition to the area of the sensing device being smaller than the area of the active heterojunction transistor, a gate width of the sensing device may be smaller than a gate width of the active heterojunction transistor by a factor of at least 5. In some examples by a factor of at least 10, a factor of at least 100, or by a factor of at least 1000.

In some examples, the first terminal of the III-nitride power semiconductor based heterojunction diode may be an anode terminal, and the second terminal of the III-nitride power semiconductor based heterojunction diode may be a cathode terminal.

In some examples, the active device may comprise an active heterojunction transistor (e.g. a GaN HEMT). In several of the examples described herein, the terms "active device", "active heterojunction transistor", and "GaN HEMT" are used interchangeably.

In some examples, the sensing device may comprise a sensing transistor. In some examples, the sensing device may comprise a sensing diode. In several of the examples described herein, the terms "sensing device", "sensing transistor", and "sensing diode" are used interchangeably.

In some examples, the sensing device (e.g. sensing transistor or diode) may be structurally similar to the active device.

The sensing device may further comprise a sensing device internal gate terminal.

In some examples, the sensing device may be structurally identical to the active device.

A "current through the sensing device" may mean a current flowing between the sensing device source terminal and the sensing device drain terminal.

A "voltage drop across the sensing load" may mean a voltage or potential drop between the first sensing load terminal and the second sensing load terminal.

In some examples, the sensing load may be monolithically integrated with the active device and/or the sensing device.

Alternatively, the sensing load could be external and not monolithically integrated. In this example, at least one additional terminal may be required to accommodate the connection of an external sensing load.

In some examples, a current through the sensing device may correspond to a current between the first and second terminals (e.g. anode and cathode terminals) of the III-nitride power semiconductor based heterojunction diode reduced by a factor of e.g. 5, 10, 100, or 1000. For example, the current through the sensing device may be reduced relative to the current between the first and second terminals of the III-nitride power semiconductor based heterojunction diode in proportion to the relative difference in area or gate width between the active device and the sensing device.

When the internal gate terminal potential is raised above the anode terminal (preferably by more than a threshold voltage of the active device) the charge density of the electrons within the two-dimensional carrier gas under the active gate region is increased, and consequently, the on-state forward voltage drop between the anode and cathode is reduced. This in turn helps to reduce the on-state losses of the diode. The consequence is that the smart GaN diode would have a smaller forward voltage drop and therefore better on-state performance compared to a standard, prior-art GaN diode.

As described above in relation to the first aspect of the invention, the III-nitride power semiconductor based heterojunction diode described in the second aspect of the invention could be an intrinsic part of a device which has an addition external terminal—the control terminal. The control terminal could be connected to the internal gate of the active device. When the second terminal has a higher potential than the first terminal, the device behaves as switch with the control terminal modulating the flow of current from the second terminal to the first terminal, and wherein the first terminal has a higher potential than the second terminal the III-nitride power semiconductor based heterojunction device behaves as a diode as described in the second aspect of this invention.

In some examples, the III-nitride power semiconductor based heterojunction diode further comprises a feedback circuit, wherein the feedback circuit is configured to detect a forward current through the sensing device and/or a positive voltage drop across the sensing load (where a positive voltage drop means that the first sensing load terminal is at a higher potential than the second sensing load terminal); and wherein the feedback circuit is further configured to provide a potential to the internal gate terminal upon detection of a forward current through the sensing device and/or a positive voltage drop across the sensing load, wherein the potential provided to the internal gate terminal is greater than a potential at the first terminal, thereby causing an additional electron charge to form within the two-dimensional carrier gas, and thereby further causing an on-state voltage drop between the first terminal and the second terminal to be lowered.

The feedback circuit may comprise a first feedback circuit terminal, a second feedback circuit terminal, and a third feedback circuit terminal; wherein the first feedback circuit terminal is connected to the first sensing load terminal; wherein the second feedback circuit terminal is connected to the second sensing load terminal; and wherein the third feedback circuit terminal is connected to the internal gate terminal;

According to a third aspect of this invention, there is provided a III-nitride power semiconductor based heterojunction diode (also termed in this disclosure as the smart high voltage/power GaN diode) comprising a first terminal and a second terminal and further comprising a substrate and an active device formed on the substrate, the active device comprising:

i. a III-nitride semiconductor region comprising a heterojunction comprising an active two-dimensional carrier gas;
ii. a source terminal operatively connected to the III-nitride semiconductor region and further connected to the first terminal;
iii. a drain terminal laterally spaced from the first terminal and operatively connected to the III-nitride semiconductor region and further connected to the second terminal;
iv. an active gate region formed over the III-nitride semiconductor region and between the first terminal and the second terminal; and
v. an internal gate terminal operatively connected to the active gate region;
b. the III-nitride power semiconductor based heterojunction diode further comprising
a sensing device, the sensing device comprising:
i. a sensing device source terminal; and
ii. a sensing device drain terminal;
iii. wherein an area of the sensing device is smaller than an area of the active device by a factor of at least 5;
c. the III-nitride power semiconductor based heterojunction device further comprising a sensing load, the sensing load comprising a first sensing load terminal and a second sensing load terminal;
d. wherein the first sensing load terminal is connected to the first terminal;
e. wherein the sensing device source terminal is connected to the second sensing load terminal; and
f. wherein the sensing device drain terminal is connected to the drain terminal of the active device;
g. wherein the III-nitride power semiconductor based heterojunction diode further comprises a feedback circuit;
h. wherein the feedback circuit is configured to detect a forward current through the sensing device and/or a positive voltage drop across the sensing load; and
i. wherein the feedback circuit is further configured to provide a potential to the internal gate terminal upon detection of a forward current through the sensing device and/or a positive voltage drop across the sensing load, wherein the potential provided to the internal gate terminal is greater than a potential at the first terminal (e.g. when a bias is applied between the first terminal and the second terminal).

Providing a potential to the internal gate terminal upon detection of a forward current through the sensing device and/or a positive voltage drop across the sensing load, wherein the potential provided to the internal gate terminal is greater than a potential at the first terminal, may cause an additional electron charge to form within the two-dimensional carrier gas, thereby further causing an on-state voltage drop between the first terminal and the second terminal to be lowered.

When the first terminal of the sensing load has a higher potential than the second terminal of the sensing load, the feedback circuit could provide a potential to the internal gate terminal of the active device that is in excess of the potential of the source of the active device (anode terminal of the smart GaN diode) such to enhance the electron density in the 2DEG layer within the active gate region. This results in a lower on-state voltage drop between the anode and cathode terminals which leads to a lower on-state voltage drop during the forward conduction of the smart GaN diode. The excess potential could be higher than a threshold voltage of the active device.

The feedback circuit may comprise a first feedback circuit terminal, a second feedback circuit terminal, and a third feedback circuit terminal; wherein the first feedback circuit terminal is connected to the first sensing load terminal; wherein the second feedback circuit terminal is connected to the second sensing load terminal; and wherein the third feedback circuit terminal is connected to the internal gate terminal.

The feedback circuit could contain one or several low-voltage or high voltage inverters, HEMT enhancement mode or depletion mode low-voltage or high voltage transistors, resistors made of metal or 2DEG layers and current sources.

The feedback circuit could have an additional terminal connected to a low voltage supply. This voltage supply (VDD) could be for example DC voltage (e.g. 5V) in excess of an anode voltage potential. The VDD voltage could be generated externally from a gate driver or controller or could be provided internally via a start-up circuit (as described below in the fourth aspect of this invention).

As described in relation to the first and second aspects of the invention, the III-nitride power semiconductor based heterojunction diode according to the third aspect of the invention could be an intrinsic part of a device which has an addition external terminal—the control terminal. The control terminal could be connected to the internal gate of the active device. When the second terminal has a higher potential than the first terminal, the device behaves as switch with the control terminal modulating the flow of current from the second terminal to the first terminal, and wherein the first terminal has a higher potential than the second terminal the III-nitride power semiconductor based heterojunction device behaves as a diode as described in the third aspect of this invention.

In some examples, the sensing device (e.g. sensing transistor or diode) may be structurally similar to the active device.

The sensing device may further comprise a sensing device internal gate terminal.

In some examples, the sensing device may be structurally identical to the active device.

According to a fourth aspect of this invention, there is provided a III-nitride power semiconductor based heterojunction diode (also termed in this disclosure as the smart high voltage/power GaN diode) comprising a first terminal (e.g. anode terminal) and a second terminal (e.g. cathode terminal) and further comprising a substrate and an active device formed on the substrate, the active device comprising:
  i. a III-nitride semiconductor region comprising a heterojunction comprising an active two-dimensional carrier gas;
  ii. a source terminal operatively connected to the III-nitride semiconductor region and further connected to the first terminal;
  iii. a drain terminal laterally spaced from the first terminal and operatively connected to the III-nitride semiconductor region and further connected to the second terminal;
  iv. an active gate region formed over the III-nitride semiconductor region and between the first terminal and the second terminal; and
  v. an internal gate terminal operatively connected to the active gate region;

b. the III-nitride power semiconductor based heterojunction diode further comprising a sensing device, the sensing device comprising:
  i. a sensing device source terminal; and
  ii. a sensing device drain terminal;
  iii. wherein an area of the sensing device is smaller than an area of the active device by a factor of at least 5;
    c. the III-nitride power semiconductor based heterojunction device further comprising a sensing load, the sensing load comprising a first sensing load terminal and a second sensing load terminal;
    d. wherein the first sensing load terminal is connected to the first terminal;
    e. wherein the sensing device source terminal is connected to the second sensing load terminal; and
    f. wherein the sensing device drain terminal is connected to the drain terminal of the active device;
    g. wherein the III-nitride power semiconductor based heterojunction diode further comprises a feedback circuit, the feedback circuit comprising a first feedback circuit terminal, a second feedback circuit terminal, a third feedback circuit terminal; and a fourth feedback circuit terminal;
    h. wherein the first feedback circuit terminal is connected to the first sensing load terminal; wherein the second feedback circuit terminal is connected to the second sensing load terminal; and wherein the third feedback circuit terminal is connected to the internal gate terminal;
    i. wherein the III-nitride power semiconductor based heterojunction diode further comprises a start-up circuit, the start-up circuit comprising:
  i. a first start-up circuit terminal;
  ii. a second start-up circuit terminal; and
  iii. a third start-up circuit terminal; and
    j. wherein the first start-up circuit terminal is connected to the first terminal of the III-nitride power semiconductor based heterojunction diode;
    k. wherein the second start-up circuit terminal is connected to the second terminal of the III-nitride power semiconductor based heterojunction diode; and
    l. wherein the third start-up circuit terminal is connected to the fourth feedback circuit terminal.

The feedback circuit may be a feedback circuit as described above.

The third start-up circuit terminal may be configured as an output terminal.

The start-up circuit may provide a rail potential (e.g. 5V) to the feedback circuit, wherein the rail potential is higher than the anode potential of the active device by at least one threshold voltage of the active device.

Upon the detection of a forward current through the sensing device (e.g. flowing from the source of the sensing device to the drain of the sensing device) or a positive voltage drop across the sensing load (e.g. between the first terminal of the sensing load and the second terminal of the sensing load) the feedback circuit provides a potential to the internal gate terminal in excess of the anode terminal potential such that an additional electron charge is formed within the two-dimensional carrier gas formed under the active gate region, such that the on-state voltage drop between the first terminal (anode) and the second terminal (cathode) is lowered.

In all the aspects of the invention, the main device/diode, the sensing device/diode, the feedback circuit or the start-up circuit could be partly or fully monolithically integrated. Different devices and circuits could be isolated from each other by using distinctive regions of active areas (active areas are regions that naturally contain 2DEG layers). Isolation regions could be placed between devices or circuits. These isolation regions have the 2DEG disabled by either etching through the AlGaN/GaN heterojunction or by appropriate doping or by using etch and fill techniques using for example dielectric materials. Alternatively, shields made commonly of metal layers or regions or 2DEG regions connected to an appropriate potential (e.g. ground) could be placed between different devices or circuits, to minimise cross-talk, interference or leakage from one component to another.

In all aspects of the invention, a signal conditioning block circuit could be monolithically integrated within the smart GaN diode (or provided externally) to amplify the sensing signal, provide immunity to noise or improve the linearity of the sensing signal in examples of this invention where linearity of the sensing signal is an important parameter. The signal conditioning circuit could also provide temperature compensation functions in order to provide a more accurate current sensing function at different ambient or operating temperatures.

The signal conditioning circuit may comprise circuit blocks such as an amplifier, buffer, Schmitt trigger, latching circuit, voltage follower, logic gate, inverter, level shifter, filter or similar.

As described above in relation to the third aspect of the invention, the III-nitride power semiconductor based heterojunction diode according to the fourth aspect of the invention could be an intrinsic part of a device which has an addition external terminal—the control terminal. The control terminal could be connected to the internal gate of the active device. When the second terminal has a higher potential than the first terminal, the device behaves as switch with the control terminal modulating the flow of current from the second terminal to the first terminal, and wherein the first terminal has a higher potential than the second terminal the III-nitride power semiconductor based heterojunction device behaves as a diode as described in the fourth aspect of this invention.

In some examples, according to any of the aspects of the invention described herein, the sensing device may comprise:
a. a sensing device III-nitride semiconductor region comprising a heterojunction comprising a sensing device two-dimensional carrier gas;
b. a sensing device gate region formed over the sensing device III-nitride semiconductor region; and
c. a sensing device gate terminal;
d. wherein the sensing device source terminal is operatively connected to the sensing device III-nitride semiconductor region;
e. wherein the sensing device drain terminal is operatively connected to the sensing device III-nitride semiconductor region; and
f. wherein the sensing device gate terminal is operatively connected to the sensing device gate region.

It will be understood that the designations "sensing device III-nitride semiconductor region", "sensing device two-dimensional carrier gas", "sensing device gate terminal", and "sensing device gate region" serve to differentiate the III-nitride semiconductor region, two-dimensional carrier gas, gate terminal, and gate region of the sensing device from corresponding features of the active device.

We also describe herein a III-nitride power semiconductor based heterojunction device comprising the III-nitride power semiconductor based heterojunction diode according to any of the aspects and examples of the invention described herein, the III-nitride power semiconductor based heterojunction device further comprising:
i. a control terminal, wherein the control terminal is connected to the internal gate of the active device and wherein:
  (i) when, in use and the second terminal has a higher potential than the first terminal, the III-nitride power semiconductor based heterojunction device is configured as a switch, wherein the control terminal is configured to modulate a flow of current from the second terminal to the first terminal; and
  (ii) when, in use, and the first terminal has a higher potential than the second terminal, the III-nitride power semiconductor based heterojunction device is configured to operate as a diode.

BRIEF DESCRIPTION OF THE DRAWINGS

The present invention will now be described by way of example with reference to the following drawings.

DETAILED DESCRIPTION OF THE PREFERRED EMBODIMENTS

Figure 1:
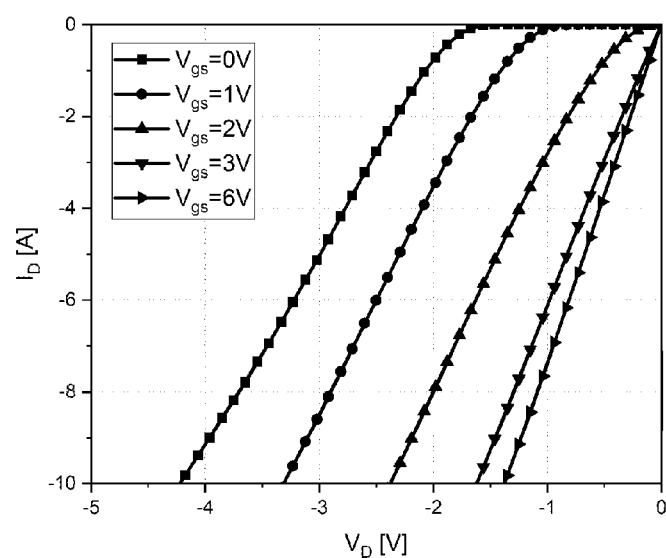
FIG. 1 is a graph illustrating a typical reverse conduction I-V characteristic of a GaN HEMT.
Figure 2:
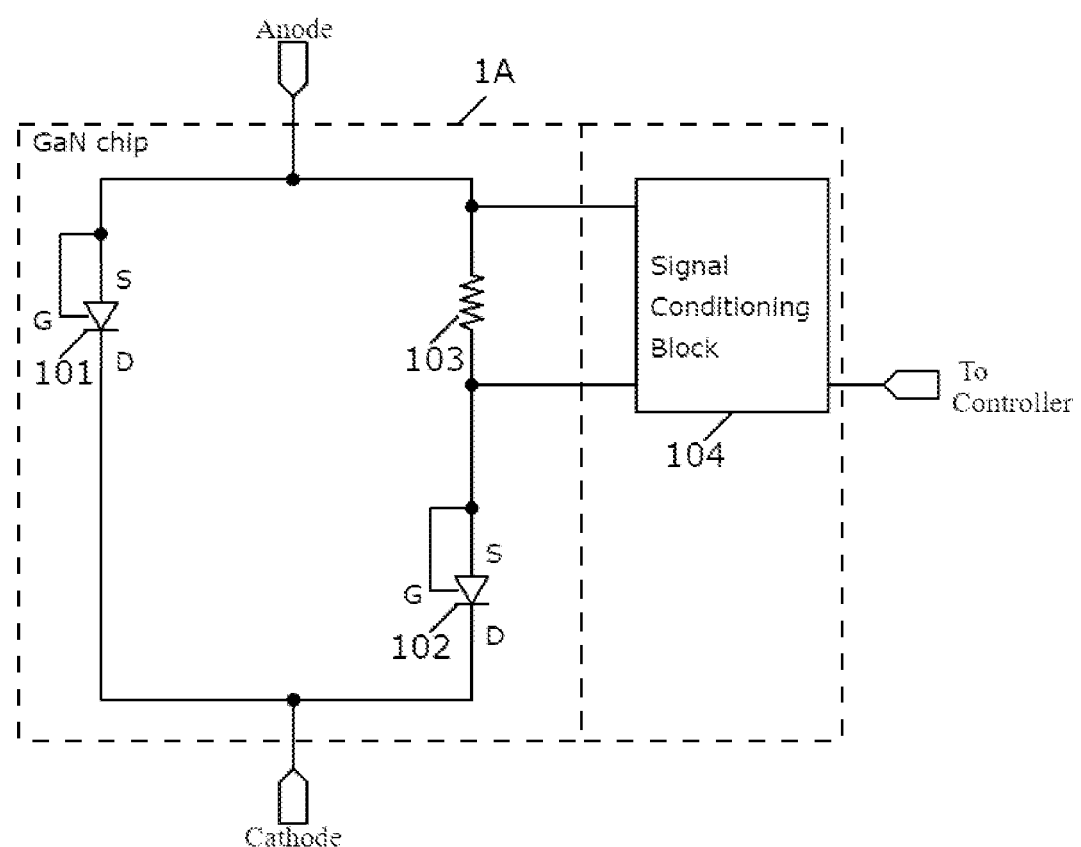
FIG. 2 shows a basic diagram of a III-nitride semiconductor based heterojunction diode according to the first aspect of the invention.

FIG. 2 shows a basic diagram of a Smart GaN Diode 1A according to the first aspect of the invention. Device 101 is the active (or otherwise referred to as main) heterojunction transistor (i.e. the active device) connected in a diode configuration with the source of the heterojunction transistor connected to its gate. Device 102 is the sensing diode. It is similar in structure to device 101, but has a much smaller area (e.g. by 10×, 100×, 1000×). The sensing load is represented by a resistor 103 (or a resistive element) placed between the Anode of the Smart GaN Diode 1A and the source of device 102 (the anode of device 102). In some examples, by measuring the current through device 102 and multiplying by a certain factor (10×, 100×, 1000×), the current through the main diode 101 can be found. In these examples, the resistance of the sensing load may need to be small in comparison to the resistance of device 102. Alternatively, the voltage drop on the sensing resistive load could be indicative of the forward biased current through the smart GaN diode 1A. The voltage drop on the sensing load 103 or the current through the sensing diode 102 could be processed through a signal conditioning block circuit 104 and/or further connected to a controller.

The signal conditioning circuit may comprise circuit blocks such as an amplifier, buffer, Schmitt trigger, latching circuit, voltage follower, logic gate, inverter, level shifter, filter or similar.

The signal conditioning circuit could also provide temperature compensation functions in order to provide a more accurate current sensing function at different ambient or operating temperatures.

Figure 3:
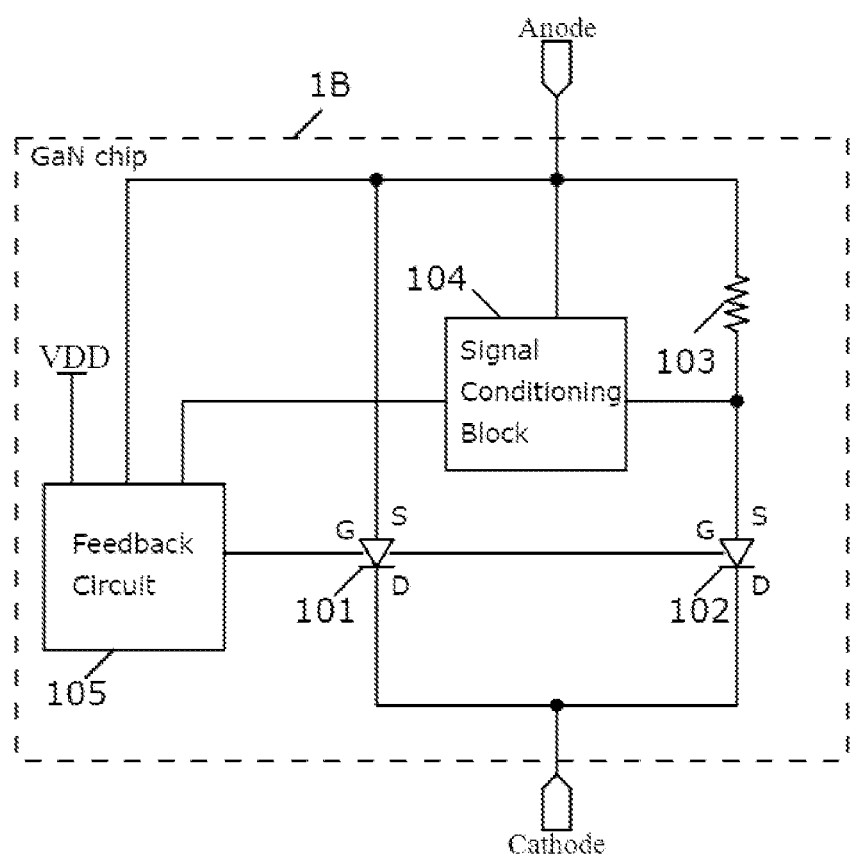
FIG. 3 shows a basic diagram of a III-nitride semiconductor based heterojunction diode according to the second aspect of the invention.

FIG. 3 shows a basic diagram of a Smart GaN Diode 1B according to a second aspect of the invention. Device 101 is the main heterojunction transistor. Device 102 is the sensing diode. It is similar in structure to device 101, but has a much smaller area (e.g. by 10×, 100×, 1000×). The sensing load is represented by a resistor 103 (or a resistive element) placed between the Anode of the Smart GaN Diode 1B and the source of device 102 (the anode of 102). A monolithically integrated feedback circuit 105 is provided. Upon detection of a forward current (greater than a specified value of a forward threshold current value) where the forward current flows through the sensing device/sensing diode 102 from anode to cathode or from source to drain for a HEMT sensing device 102 or upon detection of a voltage drop on the sensing load 103 (greater than a specified threshold voltage drop value), with a higher potential at the first terminal of the sensing load connected to the anode of the smart GaN diode 1B compared to the second potential of the sensing load connected to the source terminal of device 102, the feedback circuit 105 is configured to provide a positive potential to the gate of the main device 101, in excess of its source voltage (anode of the GaN smart diode) such that a 2DEG below the active gate is enhanced. Ideally, the excess voltage is greater than the threshold voltage of the HEMT 101 (HEMT used in a diode configuration). A signal conditioning circuit block 104 may be included between the signal from the sensing load and the feedback circuit.

Figure 4:
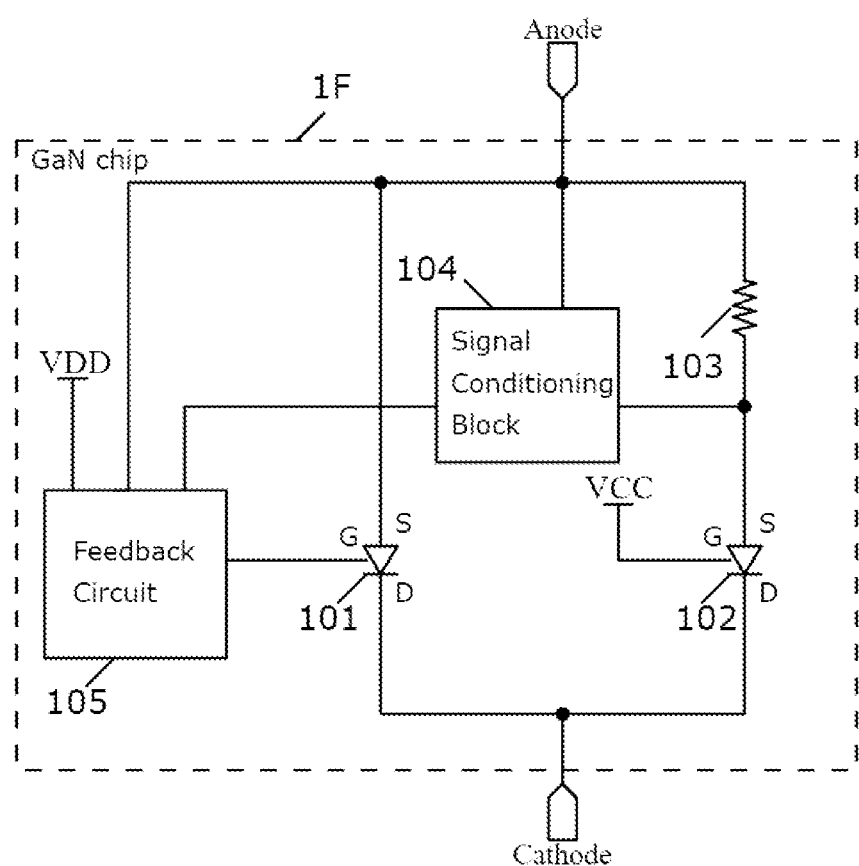
FIG. 4 shows an additional example of a III-nitride semiconductor based heterojunction diode according to second aspect of the invention.

FIG. 4 shows an additional embodiment of a smart GaN diode 1F similar to FIG. 3 where the gate of transistor 102 is connected to a fixed potential VCC rather than the gate of transistor 101. Compared to the previous embodiment, in this embodiment, a higher voltage may appear across sensing load 103 at the moment when the GaN chip goes from reverse bias to forward bias mode. The value of VCC can be chosen such that when the sensing transistor 102 is in reverse bias the leakage from cathode to anode through the sensing path is within an acceptable range. For a fixed resistance 103, the higher the value of VCC chosen the higher current through sensing transistor 102 in reverse bias operation.

In another example, the potential VCC may not be fixed but rather may be an adjustable voltage which may be controlled by an additional analogue circuit. The additional analogue circuit may be monolithically integrated or external.

Figure 5:
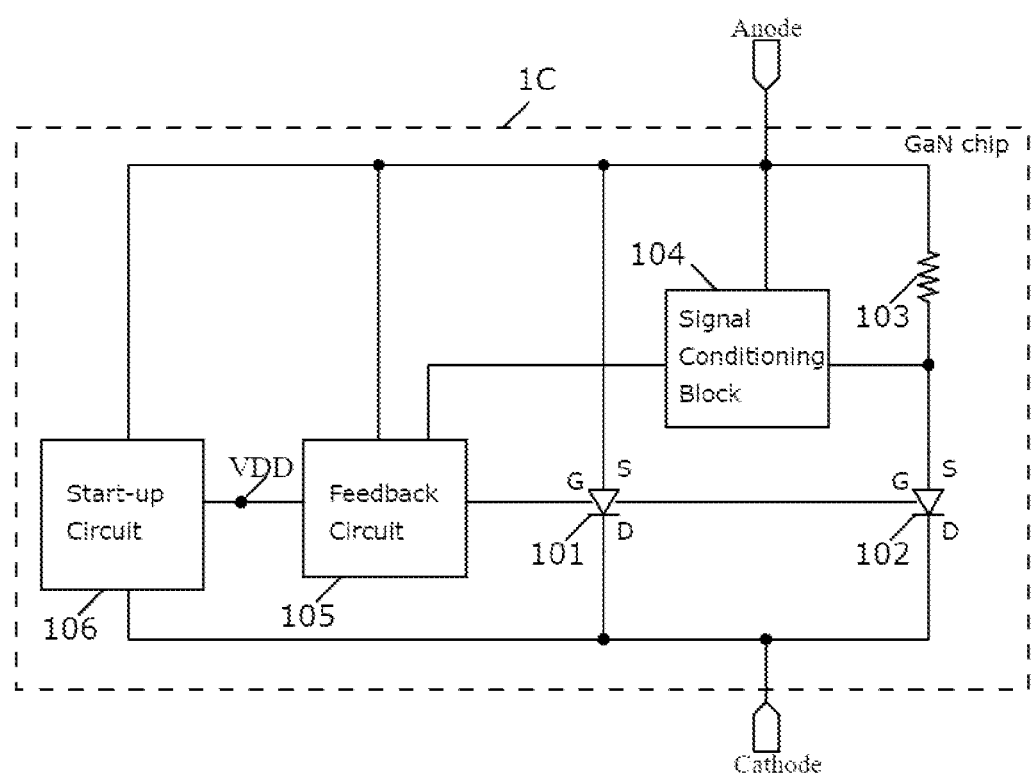
FIG. 5 shows a III-nitride semiconductor based heterojunction diode according to the present invention, further comprising a start-up circuit.

FIG. 5 has similar features/components/circuit blocks to FIG. 3 but additionally has a start-up circuit 106 with at least three terminals. A first terminal of the start-up circuit is connected to the anode terminal of the Smart GaN diode 10, a second terminal of the start-up circuit is connected to the cathode terminal of the Smart GaN diode, and an output terminal of the start-up circuit is connected to the feedback circuit 105. The purpose of the start-up circuit is to provide an internal VDD voltage (i.e. rail voltage—e.g. 5V). The VDD potential is higher than the anode terminal of the Smart GaN diode by preferably at least a threshold voltage of the device 101. In this case, a sensing signal is received from the sensing load or through the sensing device 102, the feedback circuit powered up to VDD is configured to raise the gate terminal of 101 above the source terminal of 101 (where the source terminal is considered as the anode of smart GaN diode) in order to enhance the charge in the 2DEG under the gate voltage region in 101 and hence reduce the voltage drop of the Smart GaN diode. The start-up circuit may contain depletion mode transistors, internal and/or external capacitors that can be charged to a value of VDD, resistors and other enhancement transistors or diodes. The start-up circuit can be monolithically integrated alongside the main device 101, the sensing device 102 and the feedback circuit 105. Isolation regions or shield regions (not shown) could be placed between different devices or circuits for better isolation and to avoid cross-talking.

Figure 6:
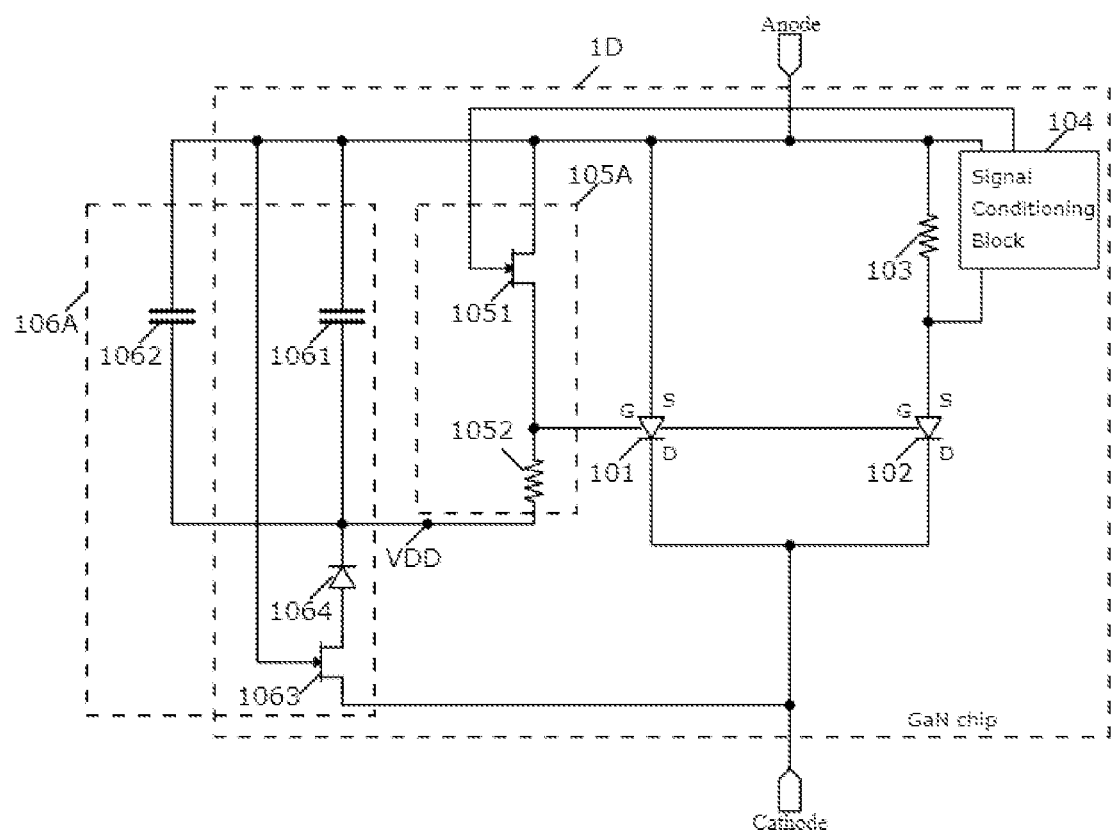
FIG. 6 shows a schematic implementation of the III-nitride semiconductor based heterojunction diode shown in FIG. 5.

FIG. 6 shows a schematic implementation of the Smart GaN diode shown in FIG. 5. The feedback may contain a simple inverter with one depletion low voltage HEMT 1051 and a resistance 1052. Ideally, the depletion low voltage device has a negative threshold voltage, very close to zero volts (from −0.1V to −0.5V) so that when a positive voltage drop is detected on the sensing load in excess of 0.1-0.5V, the source of the HEMT 1051 will be raised above its gate terminal potential by a modulus of its threshold voltage, turning the HEMT off. The main gate terminal would then be connected to VDD via the resistance. The result of it is that the voltage drop across the smart GaN diode would be lowered. The signal condition circuit 104 may be designed to offer some hysteresis such that when the voltage drop across the GaN diode is lowered, and therefore the positive voltage drop across the sensing load drops, HEMT 1051 does not turn-on. Therefore, a suitable design of the signal conditioning block may avoid oscillations on the gate terminal of the main HEMT and lead to a more stable Smart GaN diode design.

The signal conditioning circuit may comprise circuit blocks such as an amplifier, buffer, Schmitt trigger, latching circuit, voltage follower, logic gate, inverter, level shifter, filter or similar.

The start-up circuit also comprises a depletion mode HEMT 1063 and one or multiple parallel capacitors which could be monolithically integrated 1061 or provided externally 1062. When the cathode of the Smart GaN diode 1D is biased at high voltage with respect to the anode of the Smart GaN diode, the at least one capacitor is charged, until the source terminal of the depletion mode HEMT of the start-up circuit 106A is raised above its gate terminal by more than a threshold voltage. The threshold voltage of the start-up depletion mode HEMT should be preferably from −4V to −6V. In order for capacitors 1061, 1062 not to be discharged to the cathode when the cathode is a lower voltage with respect to the anode of the smart GaN diode, diode 1064 may be connected as illustrated in FIG. 6.

Other implementations are possible.

Figure 7:
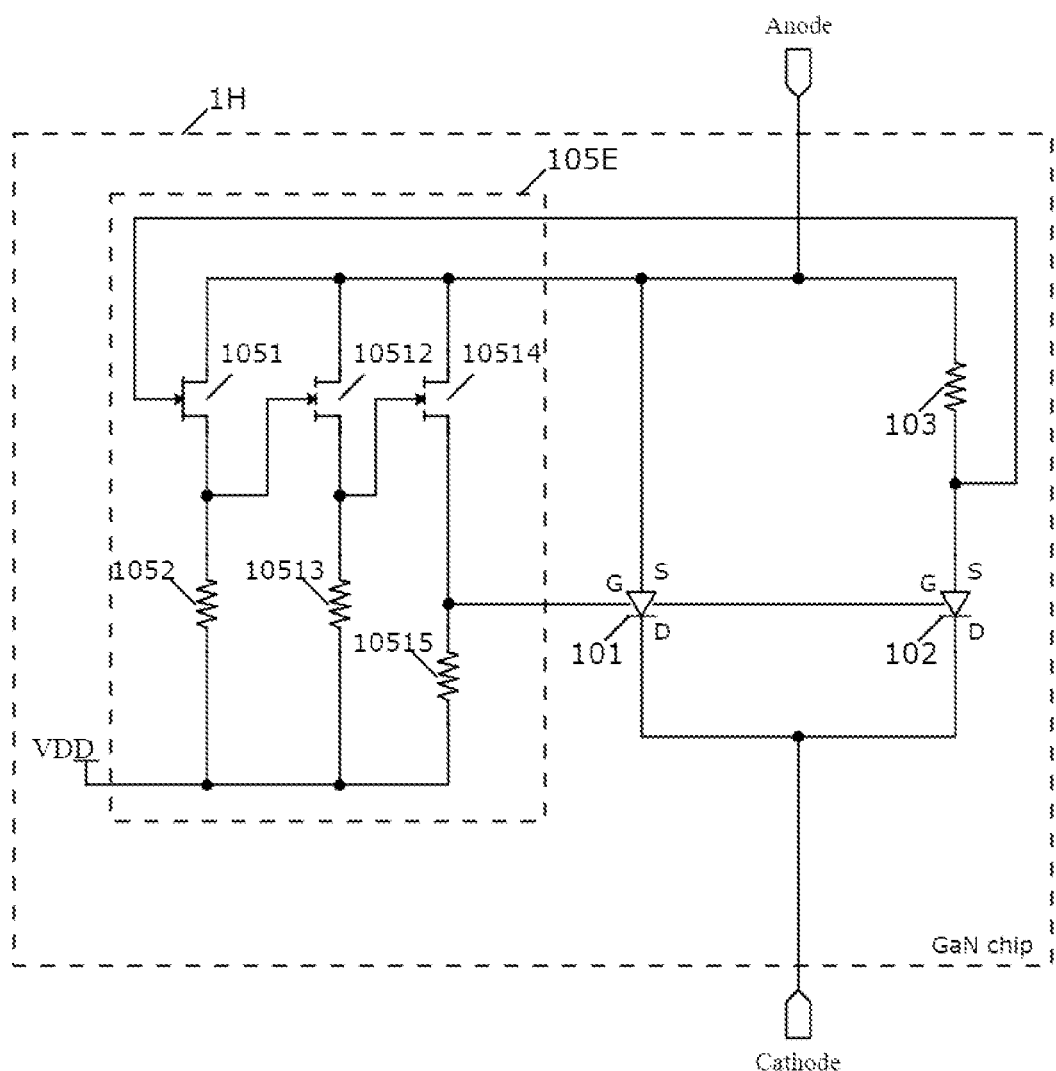
FIG. 7 shows an implementation of the III-nitride semiconductor based heterojunction diode shown in FIG. 6, further comprising two additional inverting stages.

FIG. 7 shows an additional embodiment where two additional inverting stages have been added to the feedback circuit in FIG. 6. First additional inverter stage comprises an enhancement mode HEMT 10512 and a resistor 10513. Second additional inverter stage comprises an enhancement mode HEMT 10514 and a resistor 10515. For simplicity, the VDD generating circuit is not shown in FIG. 7 and VDD is assumed to be provided either internally or externally. In this embodiment, the additional inverter stages may offer the ability to improve the speed of the feedback circuit while minimizing the power dissipation of the feedback circuit when the GaN chip is in reverse bias operation. Resistors 1052, 10513, 10515 may be replaced by current sources, or actively switched transistors for a better speed/power consumption trade-off. Signal conditioning block circuit is not included in FIG. 7 for simplicity but may be present in a different example.

Figure 8:
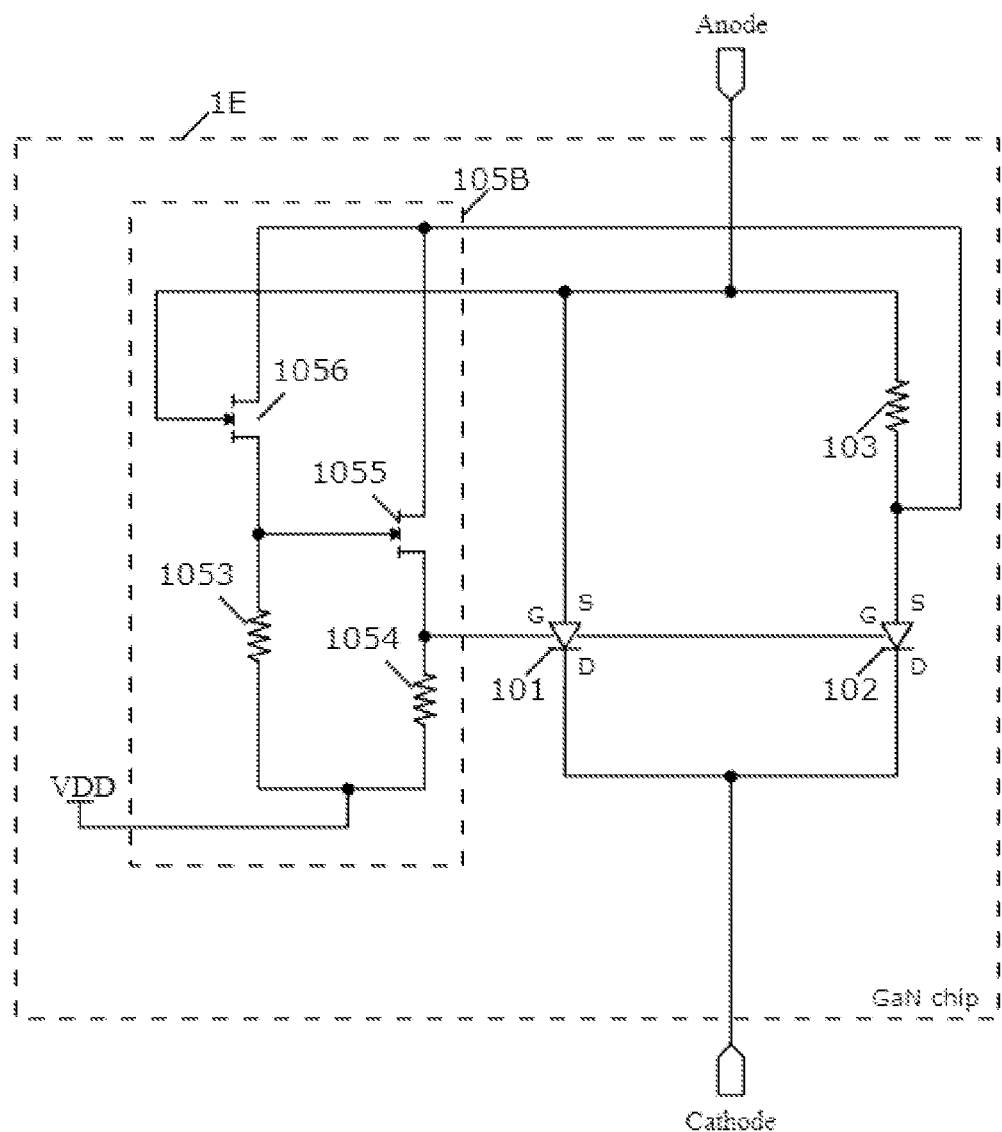
FIG. 8 shows an implementation of the III-nitride semiconductor based heterojunction diode shown in FIGS. 5 and 6, further comprising two low-voltage enhancement mode HEMTs and resistors.

FIG. 8 shows another possible implementation of the circuit shown in FIG. 5 and FIG. 6. For simplicity, no start-up circuit is shown here, and VDD is assumed to be provided either internally or externally.

The configuration comprises two low-voltage enhancement mode HEMTs 1055 1056 and resistors 1053 1054, all preferably monolithically integrated with the main device 101 and the sensing device 102. When a positive voltage drop is sensed across the sensing load 103 (above a specified threshold value), the feedback circuit 105B comprising the two inverters is configured to supply VDD to the gate of the main device 101.

If the sensing load has zero or a negative voltage drop, the gate of transistor 101 is connected to the source of transistor 101 and blocks the current through it. This is useful when the Smart GaN diode 1E is off in the zero bias or reverse bias mode.

Signal conditioning block circuit is not included in FIG. 8 for simplicity but may be present in a different example.

Figure 9:
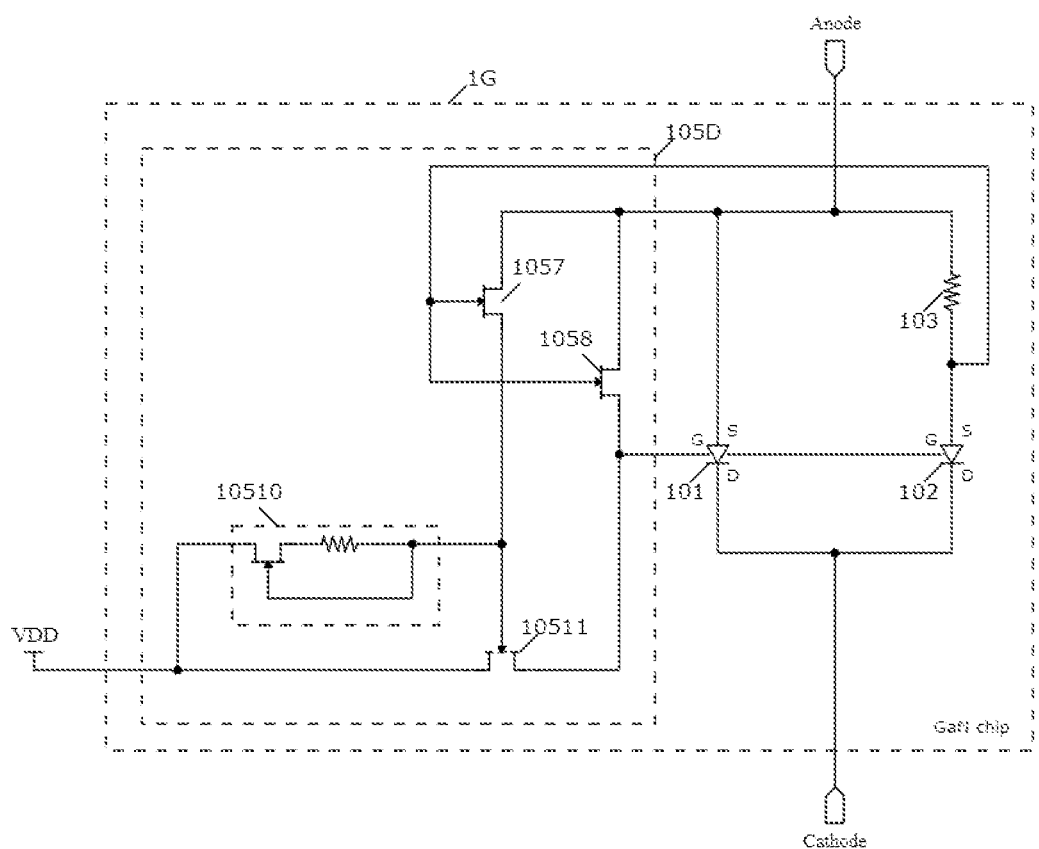
FIG. 9 shows an implementation of the III-nitride semiconductor based heterojunction diode shown in FIGS. 5 and 6 wherein a trade-off between the power consumption of the feedback circuit and the speed of the feedback circuit may be more optimal.

FIG. 9 shows another possible implementation of the circuit shown in FIG. 5 and FIG. 6. For simplicity, no start-up circuit is shown here, and VDD is assumed to be provided either internally or externally.

In this embodiment, the trade-off between the power consumption of the feedback circuit and the speed of the feedback circuit may be more optimal compared to previous embodiments. The voltage drop across sensing load 103 constitutes the gate-source bias of depletion mode transistors 1057 and 1058. During reverse bias of transistors 101 and 102, the gate-source voltage of transistors 1057 and 1058 is almost zero volts keeping these transistors in the on-state, and therefore connecting the gate of transistor 101 and transistor 102 to anode potential. Scaling of current source 10510 determines the majority of the static power loss in the feedback circuit in this condition. During forward bias of transistors 101 and 102, depletion mode HEMTs 1057 and 1058 become more resistive as a negative gate-source potential is applied to the terminals. Current source 10510 charges the node connected to the gate terminal of enhancement mode transistor 10511, therefore allowing a current from VDD to flow through transistor 10511 and charge the gate-source capacitance of transistors 101 and 102. The bias of the gate terminal of transistor 101 can reach a maximum bias of VDD-Vth where Vth is the threshold voltage of enhancement mode transistor 10511. Other implementations of a current source 10510 may be used.

Signal conditioning block circuit is not included in FIG. 9 for simplicity but may be present in a different example.

Figure 10:
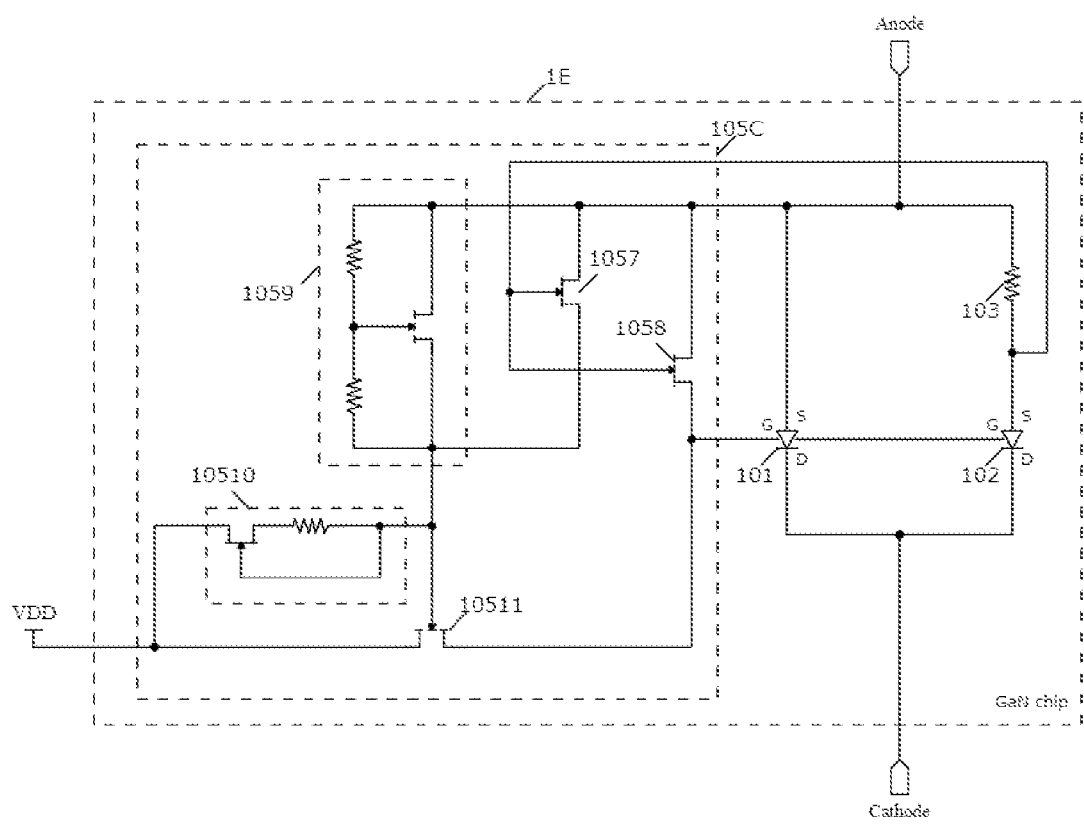
FIG. 10 shows an implementation of the III-nitride semiconductor based heterojunction diode shown in FIG. 9, further comprising a pull-down circuit.

FIG. 10 shows an additional embodiment similar to FIG. 9 which operates in a similar manner in both the forward and reverse bias mode of operation. This embodiment contains an additional circuit block that is pull-down circuit 1059. This embodiment allows the opportunity to clamp the maximum voltage bias which may appear on the gate terminal of transistors 101 and 102 by appositely designing the pull-down circuit. This may be useful in a design where the magnitude of the VDD signal available on chip is too high and may damage the gate terminal of transistor 101 if the full extent of the VDD signal is applied to it. Other implementations of a pull-down circuit 1059 may be used.

Signal conditioning block circuit is not included in FIG. 10 for simplicity but may be present in a different example.

The skilled person will understand that in the preceding description and appended claims, positional terms such as 'top', 'above', 'overlap', 'under', 'lateral', etc. are made with reference to conceptual illustrations of a device, such as those showing standard cross-sectional perspectives. These terms are used for ease of reference but are not intended to be of limiting nature.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

REFERENCES

[1] U. K. Mishra et al., GaN-Based RF power devices and amplifiers, Proc. IEEE, vol 96, no 2, pp 287-305, 2008.
[2] M. H. Kwan et al, CMOS-Compatible GaN-on-Si Field-Effect Transistors for High Voltage Power Applications, IEDM, San Fran., December 2014, pp 17.6.1-17.6.4
[3] S. Lenci et al., Au-free AlGan/GaN power diode 8-in Si substrate with gated edge termination, Elec. Dev. Lett., vol 34, no 8, pp 1035, 2013.
[4] D. Disney, H. Nie, A. Edwards, D. Bour, H. Shah and I. C. Kizilyalli, "Vertical power diodes in bulk GaN," 2013 25th International Symposium on Power Semiconductor Devices & IC's (ISPSD), 2013, pp. 59-62

The invention claimed is:

1. A III-nitride power semiconductor based heterojunction diode comprising a first terminal and a second terminal and further comprising a substrate and an active device formed on the substrate, the active device comprising:
   a III-nitride semiconductor region comprising a heterojunction comprising an active two-dimensional carrier gas;
   a source terminal operatively connected to the III-nitride semiconductor region and further connected to the first terminal;
   a drain terminal laterally spaced from the first terminal and operatively connected to the III-nitride semiconductor region and further connected to the second terminal;
   an active gate region formed over the III-nitride semiconductor region and between the first terminal and the second terminal; and
   an internal gate terminal operatively connected to the active gate region;

the III-nitride power semiconductor based heterojunction diode further comprising a sensing device, the sensing device comprising:
  a sensing device source terminal; and
  a sensing device drain terminal;
  wherein an area of the sensing device is smaller than an area of the active device by a factor of at least 5;
the III-nitride power semiconductor based heterojunction diode further comprising:
a sensing load, the sensing load comprising a first sensing load terminal and a second sensing load terminal;
wherein the first sensing load terminal is connected to the first terminal;
wherein the sensing device source terminal is connected to the second sensing load terminal; and
wherein the sensing device drain terminal is connected to the drain terminal of the active device;
wherein the III-nitride semiconductor based heterojunction diode further comprises an output;
wherein the output is configured to output a sensing signal corresponding to a current through the sensing device and/or a voltage drop across the sensing load;
wherein the sensing signal is indicative of a current flowing between the first terminal and the second terminal when a bias is applied between the first terminal and the second terminal;
wherein the III-nitride power semiconductor based heterojunction diode further comprises a feedback circuit connected between the sensing load and the internal gate terminal;
wherein the feedback circuit comprises:
  a first feedback circuit terminal;
  a second feedback circuit terminal;
  a third feedback circuit terminal; and
  a fourth feedback circuit terminal;
  wherein the first feedback circuit terminal is connected to the first sensing load terminal; wherein the second feedback circuit terminal is connected to the second sensing load terminal; and wherein the third feedback circuit terminal is connected to the internal gate terminal;
wherein the feedback circuit further comprises:
  at least one inverter stage comprising at least one transistor, wherein the at least one transistor comprises:
  a transistor drain terminal;
  a transistor gate terminal; and
  a transistor source terminal;
  wherein the transistor source terminal is connected to the first feedback circuit terminal, the transistor gate terminal is operatively connected to the second feedback circuit terminal, the transistor drain terminal is connected to the third feedback circuit terminal and the internal gate terminal; and the transistor drain terminal is further operatively connected to a potential via the fourth feedback circuit terminal;
wherein the feedback circuit is configured to detect a forward current through the sensing device and/or a positive voltage drop across the sensing load; and
wherein the feedback circuit is further configured to provide a potential to the internal gate terminal upon detection of the forward current through the sensing device and/or the positive voltage drop across the sensing load, wherein the potential provided to the internal gate terminal is greater than the potential at the first terminal.

2. A III-nitride power semiconductor based heterojunction diode according to claim 1, wherein the sensing load comprises one or more resistors, capacitors, current sources and/or diodes.

3. A III-nitride power semiconductor based heterojunction diode according to claim 1, wherein the internal gate terminal of the active device is connected to the first terminal.

4. A III-nitride power semiconductor based heterojunction diode according to claim 3, wherein the sensing device further comprises a sensing device internal gate terminal; and wherein the sensing device internal gate terminal is connected to the sensing device source terminal.

5. A III-nitride power semiconductor based heterojunction diode according to claim 1, further comprising a signal conditioning block, the signal conditioning block being connected to the sensing load second terminal; wherein the signal conditioning block is configured to provide one or more temperature compensation functions to the sensing signal.

6. A III-nitride power semiconductor based heterojunction diode according to claim 1, further comprising one or more signal conditioning blocks, the one or more signal conditioning blocks being connected to the second sensing load terminal load;
  wherein the one or more signal conditioning blocks are configured to condition the sensing signal; and
  wherein the signal conditioning blocks are configured to operate as one or more of: an amplifier, a buffer, a Schmitt trigger, a latching circuit, a voltage follower, a logic gate, an inverter, a level shifter, and/or a filter.

7. A III-nitride power semiconductor based heterojunction diode according to claim 1, wherein the sensing load comprises a winding of a current sense transformer.

8. A III-nitride power semiconductor based heterojunction diode according to claim 1, wherein the sensing signal is provided as an input to an external controller.

9. A III-nitride power semiconductor based heterojunction device comprising the III-nitride power semiconductor based heterojunction diode according to claim 1, the III-nitride power semiconductor based heterojunction device further comprising:
  a control terminal, wherein the control terminal is connected to the internal gate of the active device and wherein:
  when, in use and when the second terminal has a higher potential than the first terminal, the III-nitride power semiconductor based heterojunction device is configured as a switch, wherein the control terminal is configured to modulate a flow of current from the second terminal to the first terminal; and
  when, in use and when the first terminal has a higher potential than the second terminal, the III-nitride power semiconductor based heterojunction device is configured as a diode.

10. A III-nitride power semiconductor based heterojunction diode comprising a first terminal and a second terminal and further comprising a substrate and an active device formed on the substrate, the active device comprising:
  a III-nitride semiconductor region comprising a heterojunction comprising an active two-dimensional carrier gas;
  a source terminal operatively connected to the III-nitride semiconductor region and further connected to the first terminal;

a drain terminal laterally spaced from the first terminal and operatively connected to the III-nitride semiconductor region and further connected to the second terminal;
an active gate region formed over the III-nitride semiconductor region and between the first terminal and the second terminal; and
an internal gate terminal operatively connected to the active gate region;
the III-nitride power semiconductor based heterojunction diode further comprising a sensing device, the sensing device comprising:
a sensing device source terminal; and
a sensing device drain terminal;
wherein an area of the sensing device is smaller than an area of the active device by a factor of at least 5;
the III-nitride power semiconductor based heterojunction device further comprising a sensing load, the sensing load comprising a first sensing load terminal and a second sensing load terminal;
wherein the first sensing load terminal is connected to the first terminal;
wherein the sensing device source terminal is connected to the second sensing load terminal;
wherein the sensing device drain terminal is connected to the drain terminal of the active device;
wherein the III-nitride power semiconductor based heterojunction diode further comprises a feedback circuit connected between the sensing load and the internal gate terminal;
wherein the feedback circuit comprises:
a first feedback circuit terminal;
a second feedback circuit terminal;
a third feedback circuit terminal; and
a fourth feedback circuit terminal;
wherein the first feedback circuit terminal is connected to the first sensing load terminal; wherein the second feedback circuit terminal is connected to the second sensing load terminal; and wherein the third feedback circuit terminal is connected to the internal gate terminal;
wherein the feedback circuit further comprises:
at least one inverter stage comprising at least one transistor, wherein the at least one transistor comprises:
a transistor drain terminal;
a transistor gate terminal; and
a transistor source terminal;
wherein the transistor source terminal is connected to the first feedback circuit terminal, the transistor gate terminal is operatively connected to the second feedback circuit terminal, the transistor drain terminal is connected to the third feedback circuit terminal and the internal gate terminal; and the transistor drain terminal is further operatively connected to a potential via the fourth feedback circuit terminal;
wherein the feedback circuit is configured to detect a forward current through the sensing device and/or a positive voltage drop across the sensing load; and
wherein the feedback circuit is further configured to provide a potential to the internal gate terminal upon detection of a forward current through the sensing device and/or a positive voltage drop across the sensing load, wherein the potential provided to the internal gate terminal is greater than a potential at the first terminal.

11. A III-nitride power semiconductor based heterojunction diode according to claim 10, wherein the sensing device further comprises a sensing device gate terminal; and
wherein the sensing device gate terminal is connected to the internal gate terminal of the active device.

12. A III-nitride power semiconductor based heterojunction diode according to claim 10, wherein the sensing device further comprises a sensing device gate terminal; and
wherein the sensing device gate terminal is connected to a fixed potential or an adjustable potential.

13. A III-nitride power semiconductor based heterojunction diode according to claim 10, further comprising a start-up circuit, the start-up circuit comprising:
a first start-up circuit terminal;
a second start-up circuit terminal; and
a third start-up circuit terminal;
wherein the first start-up circuit terminal is connected to the first terminal of the III-nitride power semiconductor based heterojunction diode;
wherein the second start-up circuit terminal is connected to the second terminal of the III-nitride power semiconductor based heterojunction diode; and
wherein the third start-up circuit terminal is connected to the fourth feedback circuit terminal.

14. A III-nitride power semiconductor based heterojunction diode according to claim 13, wherein the start-up circuit is configured to provide a rail potential to the feedback circuit; and wherein the rail potential is greater than a potential at the first terminal by an amount at least equal to a threshold voltage of the active device.

15. A III-nitride power semiconductor based heterojunction diode according to claim 13, wherein the start-up circuit comprises one or more of the following:
a high voltage depletion mode transistor;
internal and/or external capacitors; and/or
a diode configured to prevent discharging of the rail potential node when the second terminal is at a lower potential than the rail potential.

16. A III-nitride power semiconductor based heterojunction diode according to claim 10, wherein the feedback circuit comprises one or more of any of the following:
low voltage and/or high voltage inverters;
HEMT enhancement mode and/or depletion mode low voltage and/or high voltage transistors;
resistors comprising metal;
two-dimensional carrier gas layers; and/or
current sources.

17. A III-nitride power semiconductor based heterojunction diode according to claim 10, wherein the sensing load comprises one or more resistors, capacitors, current sources and/or diodes.

18. A III-nitride power semiconductor based heterojunction diode according to claim 10, further comprising a signal conditioning block connected between the sensing load and the feedback circuit.

* * * * *